United States Patent [19]
Frindle et al.

[11] Patent Number: 5,923,768
[45] Date of Patent: Jul. 13, 1999

[54] DIGITAL AUDIO PROCESSING

[75] Inventors: Paul Anthony Frindle, Witney; Peter Charles Eastty, Oxford, both of United Kingdom

[73] Assignees: Sony Corporation, Tokyo, Japan; Sony United Kingdom Limited, Weybridge, United Kingdom

[21] Appl. No.: 08/806,250

[22] Filed: Feb. 21, 1997

[30] Foreign Application Priority Data

| | | | |
|---|---|---|---|
| Mar. 8, 1996 | [GB] | United Kingdom | 9605004 |
| May 10, 1996 | [GB] | United Kingdom | 9609783 |

[51] Int. Cl.$^6$ ...................................... H03G 7/00
[52] U.S. Cl. ............................................. 381/106; 333/14
[58] Field of Search .................... 381/106, 104, 381/107; 333/14

[56] References Cited

U.S. PATENT DOCUMENTS

| | | |
|---|---|---|
| 4,169,219 | 9/1979 | Beard .................................... 455/235.1 |
| 4,201,109 | 5/1980 | Kitagawa . |
| 4,376,916 | 3/1983 | Glasberson . |
| 4,730,165 | 3/1988 | Nishino et al. . |
| 5,070,527 | 12/1991 | Lynn . |

FOREIGN PATENT DOCUMENTS 2179810  3/1987  United Kingdom .

*Primary Examiner*—Vivian Chang
*Attorney, Agent, or Firm*—Frommer Lawrence & Haug, LLP.; William S. Frommer; Dennis M. Smid

[57] ABSTRACT

Digital audio processing apparatus for applying a time-varying gain to an input digital audio signal over contiguous first, second and third time periods, in which: the applied gain changes at no more than a first maximum rate of change during the first time period; the applied gain changes at no more than a second maximum rate of change during the third time period; and during the second time period the rate of change of the applied gain varies monotonically from a substantially zero rate of change towards the second maximum rate of change.

10 Claims, 4 Drawing Sheets

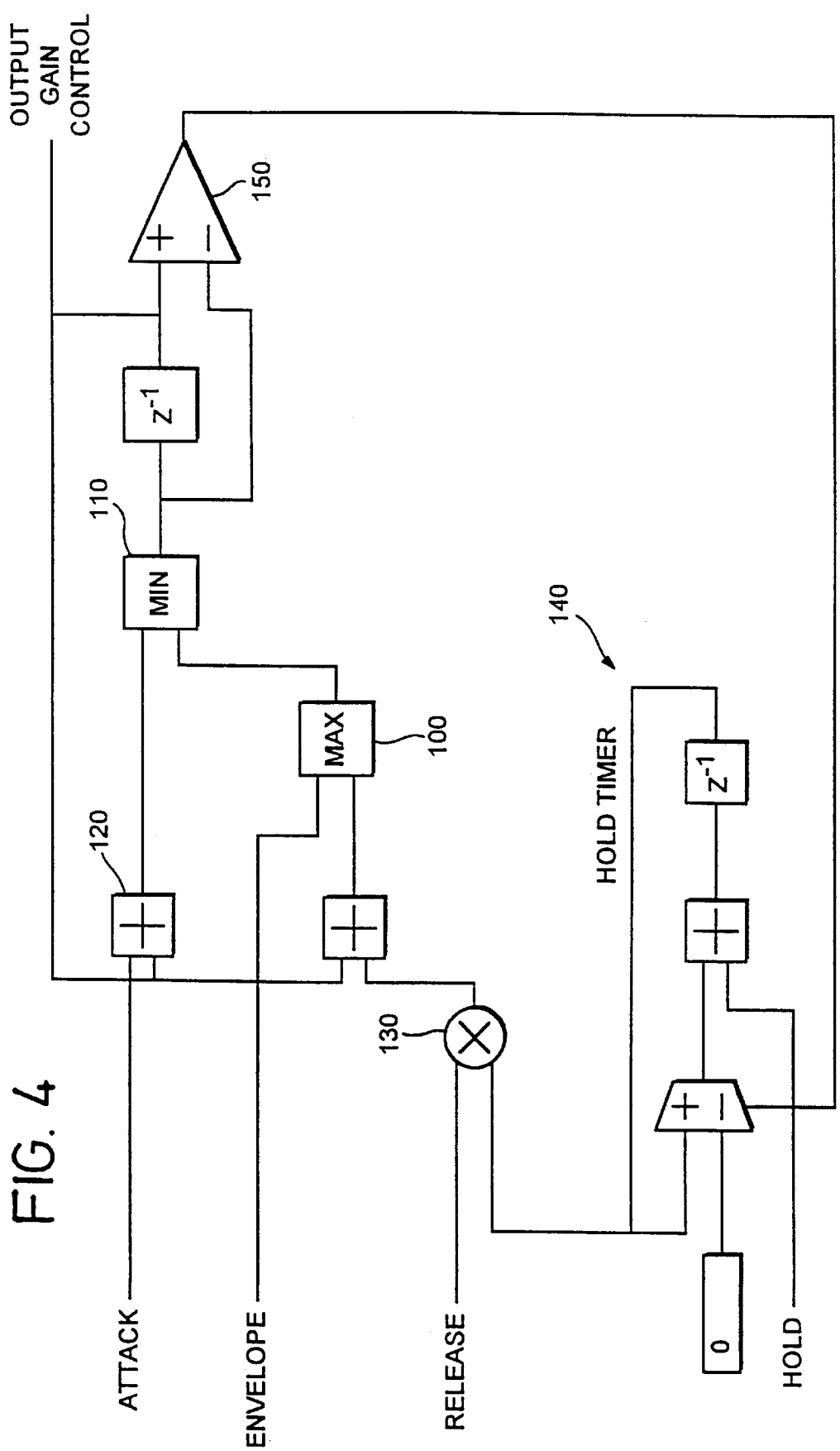

DIGITAL AUDIO PROCESSING

BACKGROUND OF THE INVENTION

1. Field of the Invention

This invention relates to the processing of digital audio signals.

2. Description of the Prior Art

In many modern audio signal processing devices, such as audio mixing consoles, audio processing operations which had previously been carried out in the analogue domain are now performed on sampled digital audio signals.

An example of this is the "dynamics" section of a digital audio mixing console. Dynamics processing refers to a family of processing techniques generally having a non-linear effect on the audio signal (compared with the substantially linear techniques of simple gain adjustment and additive mixing). In general, effects classified as "dynamics" tend to have a distorting effect on the sound represented by the audio signal, albeit often a pleasing or useful distortion. For example, the gain applied to an audio signal might be non-linearly adjusted (or "compressed") so that the audio signal has a substantially constant level—alleviating the level variations which might result as a performer moves towards and away from a microphone.

FIG. 1 of the accompanying drawings is a schematic diagram of a previously proposed compression processor, with the compression response of this processor being illustrated schematically in FIG. 2.

In FIG. 1, an input digital audio signal (for example, a digital audio signal sampled at a 48 kHz sampling rate to 16 bit resolution) is supplied in parallel to a multiplier 10 and to a processing chain 20.

The processing chain 20 comprises a peak (or envelope) detector 30, a logarithmic (linear to decibel) converter 40, a dynamics processing element 50, a control circuit 60, and a logarithmic (decibel to linear) converter 70.

The output of the logarithmic converter 70 is supplied as a second multiplicand to the multiplier 10, to be multiplied by sample values of the input digital audio signal. In this way, the output of the processing chain 20 provides a gain control for the input digital audio signal.

The dynamics processing element 50 operates in the logarithmic domain, i.e. it receives envelope values and generates gain control values in decibels rather than as linear measures. This is so that the time constants, control values and other constants used by the dynamics processing element relate to a decibel law directly, which in turn makes the implementation of the dynamics processing element more simple and intuitive.

The dynamics processor of FIG. 1 may be arranged to provide various different dynamics processing functions, depending on the way in which the dynamics processing element 50 generates an output gain control value in response to the detected envelope of the input digital audio signal. For the present explanation, consider the simple example whereby the dynamics processing element is arranged as an "attack-hold-release" compressor. This type of compressor provides a relatively quickly increasing degree of compression when the input signal envelope suddenly increases in magnitude. Then, when the input signal is no longer increasing, the level of compression attained is held substantially constant during a "hold" period. Finally, during a "release" period, the compression is reduced towards zero compression. This example compression response is illustrated schematically in FIG. 2 of the accompanying drawings.

A perceived advantage of the use of digital techniques to implement compressors of this type is the opportunity to provide an accurately predetermined compression response—for example, holding the compression accurately at the same level throughout the "hold" period.

The gain control value output by the dynamics processing element 50 is then converted to a linear control value by the logarithmic converter 70 and supplied as a multiplicand to the multiplier 10.

SUMMARY OF THE INVENTION

This invention provides digital audio processing apparatus for applying a time-varying gain to an input digital audio signal over contiguous first, second and third time periods, in which:

the applied gain changes at a first substantially constant rate of change during the first time period;

the applied gain changes at a second substantially constant rate of change during the third time period; and during the second time period the rate of change of the applied gain varies monotonically from a substantially zero rate of change towards the second substantially constant rate of change.

The invention recognizes that the discontinuity between the gain applied during the "hold" and "release" periods in this type of processor can lead to audible distortions of the digital audio signal, since the rate of change of gain at the transition time will be very high.

Embodiments of the invention address this problem by providing a more gradual transition from the hold to the release period, whereby during the hold period the gain "decays" towards the rate of change to be applied during the release period. This avoids an abrupt rate of gain change at the end of the hold period. This goes against the normal use of digital processing techniques, whereby an accurately constant compression value would be provided during the hold period.

The term "gain" is used in a general sense, whereby the gain can be less than 1 (linear) or less than 0dB (log), thus representing a compression rather than a boost of the signal to which the gain is applied.

The first, second and third time periods may of course in fact be defined by the value attained by the envelope of the input digital audio signal.

This invention also provides digital audio processing apparatus for applying a time-varying gain to an input digital audio signal in response to the envelope magnitude of the input digital audio signal, in which: the applied gain changes in response to an increasing envelope magnitude at no more than a first maximum rate of change; and the applied gain changes in response to the envelope magnitude being lower than a magnitude corresponding to a current applied gain, at a rate of change varying monotonically from a predetermined initial rate of change towards a second maximum rate of change.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 4 is a schematic diagram of a dynamics processing element for generating the compression response of FIG. 3.

DESCRIPTION OF THE PREFERRED EMBODIMENTS

Figure 1:
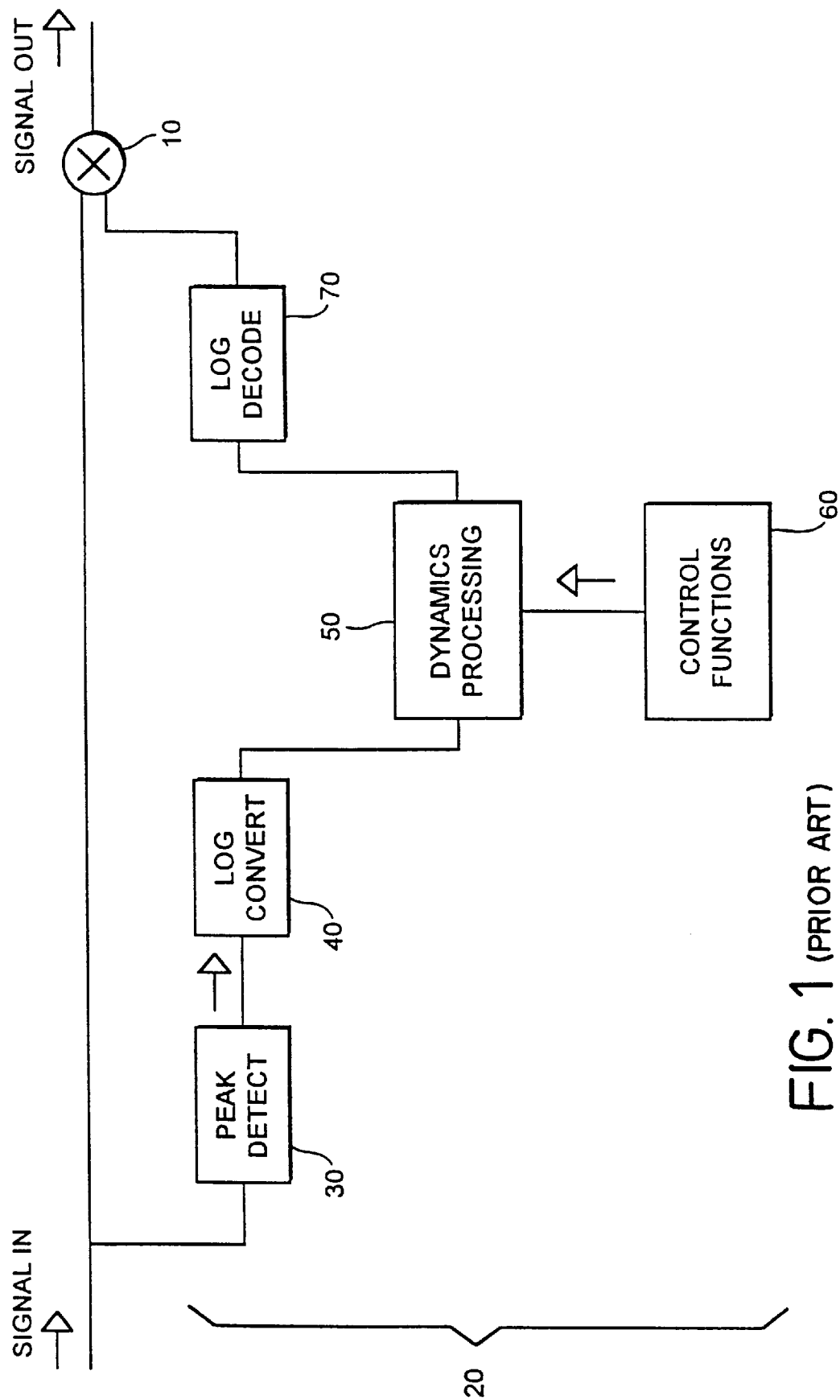
FIG. 1 is a schematic diagram of a dynamics processor.
Figure 2:
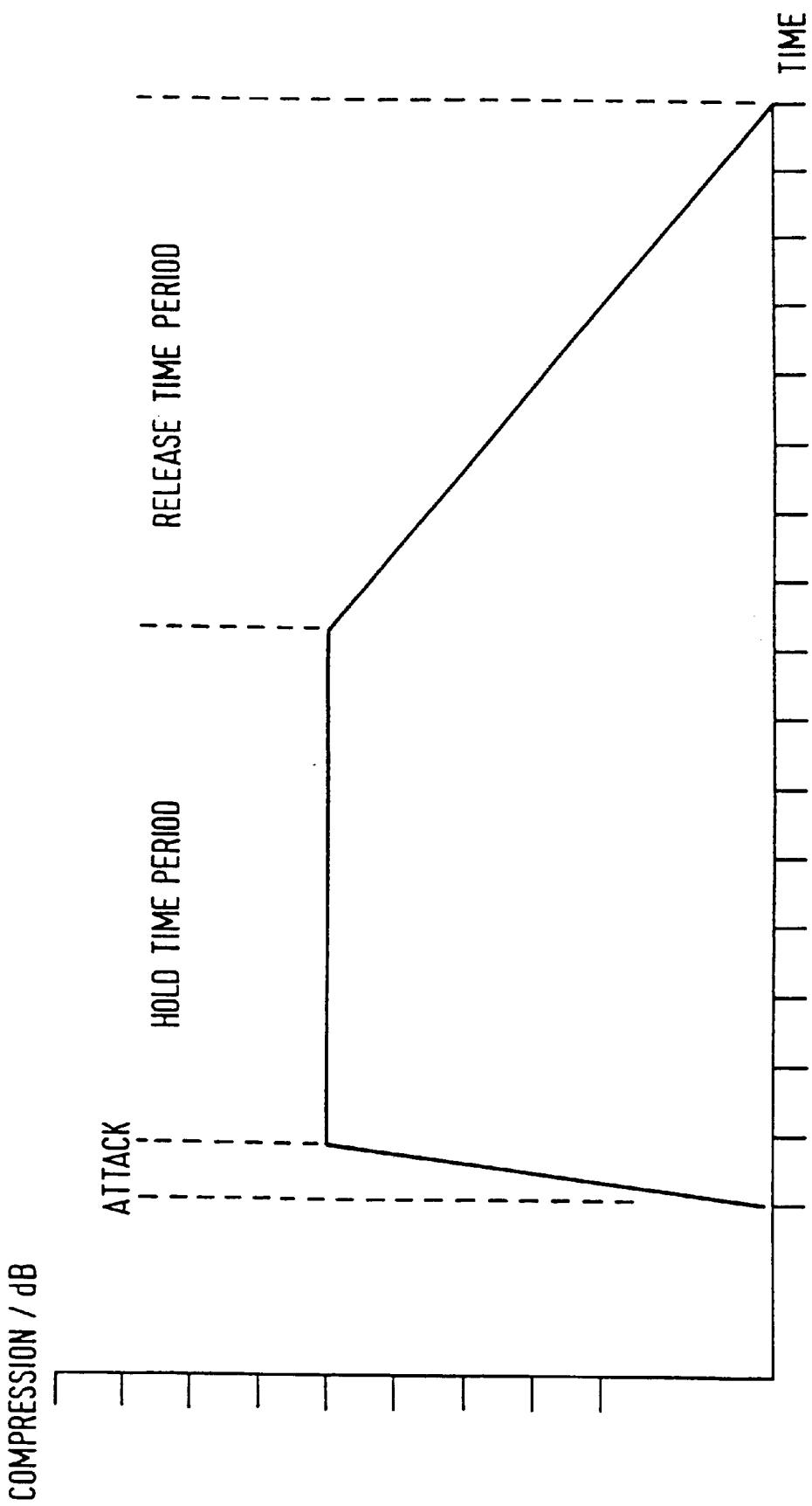
FIG. 2 is a schematic graph of a simple compression response of the processor of FIG. 1.

An embodiment of a dynamics processing element (suitable for use as the element 50 of FIG. 1) will now be described, which is operable to generate the compression response shown schematically in FIG. 3; a schematic circuit diagram of the element is shown in FIG. 4. The circuit of FIG. 4 should be considered as operating on a clocked basis, for example once per sample period of the input digital audio signal.

Referring then to FIG. 4, the dynamics processing element receives the envelope signal from the logarithmic 40, together with attack, hold and release control signals from the control circuit 60. These control signals may be generated in response to user-operable controls (not shown). The dynamics processing element generates an output gain control signal illustrated at the right hand side of FIG. 4.

In operation, the envelope of the input digital audio signal (as detected by the peak detector 30 and converted to a decibel scale by the logarithmic converter 40) is monitored. If the envelope signal increases in magnitude, a greater degree of compression is provided by varying the gain control signal.

The current level of the envelope signal is compared with the current level of the gain control signal minus the "release" control value by a maximum detector 100. (In fact, the release control value is a negative quantity so it is illustrated in FIG. 4 as being added to the current gain control value). The greater of these two values is passed by the maximum detector 100 to a minimum detector 110.

The release control value is in fact modified by a multiplier 130, to be discussed below.

Thus, if the envelope is currently increasing so that further compression is required, the envelope signal will be greater than the quantity (gain control signal minus release control signal) and so the envelope signal will be passed by the maximum detector 100. Otherwise, the quantity (gain control signal minus release control signal), will be passed by the maximum detector.

In the minimum detector 110, the value passed by the maximum detector 100 is compared with the quantity (attack control value plus current gain control value). If the degree of compression is currently increasing (during an attack phase), then the rate of increase of compression (ie the increment of the gain control value per clocking period of the circuit of FIG. 4) is limited by the minimum detector 110 to be equal to the attack control value.

After further processing, the output of the minimum detector 110 effectively becomes the next clocking period's gain control value.

So, when the envelope signal falls again, the value passed by the maximum detector will be that of the gain control value minus the release control value. By definition, this will be less than the quantity (gain control value plus attack control value), and so it will be passed by the minimum detector 110 to become the next clocking period's gain control value. Thus, the release control value sets the rate at which the compression reduces (the numerical decrement applied to the gain control value per clocking period) during the release phase.

The release control value is modified by the multiplier 130. The other multiplicand is the output of a "hold timer" 140, which is triggered to count from 0 to 1 by a comparator 150 first detecting a fall in the gain control value. The rate at which the counter counts from 0 to 1 is set by the "hold" control value.

Thus, the release control value actually used to calculate the quantity (gain control value minus release control value) passed to the maximum detector 100 varies from 0 to the value set by the control circuit, over the period of operation of the hold timer. This means that the rate of change of the gain control value during the phase in which the degree of compression reduces will initially vary from a zero rate of change to a rate specified by the release control value. Once the hold timer has reached a count of 1, it remains at that value until retriggered by the comparator 150.

Figure 3:
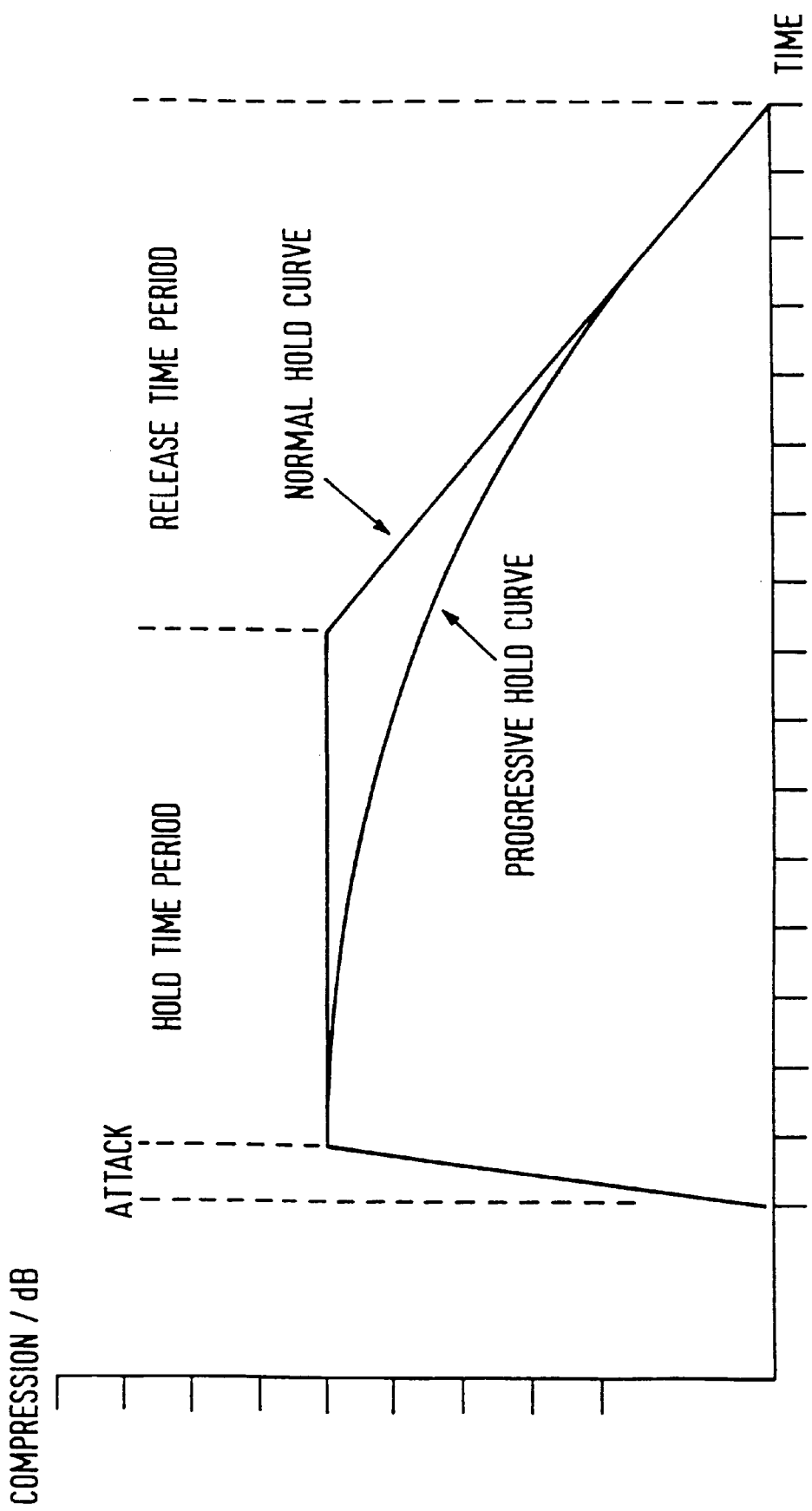
FIG. 3 is a schematic graph of a compression response provided by embodiments of the invention.

The effect of this, as illustrated in FIG. 3, is that the hold timer progressively increases the release rate over the period of the hold timer setting until the full release rate is achieved. This produces a very smooth and subjectively pleasing decay characteristic which can reduce the recovery distortion for audio signals with low frequency content.

Thus, embodiments of the invention provide digital audio processing apparatus for applying a time-varying gain to an input digital audio signal over contiguous first, second and third time periods, in which: the applied gain changes at a first substantially constant rate of change during the first ("attack") time period; the applied gain changes at a second substantially constant rate of change during the third ("release") time period; and during the second ("hold") time period the rate of change of the applied gain varies monotonically from a substantially zero of change towards the second substantially constant rate of change.

It will be clear from the description of FIG. 4 above that the length (in time) of the first, second and third time periods will depend on the maximum level attained by the envelope signal. Also, if the envelope signal increases, holds steady and then increases again, there might be a first time period, followed by a second time period, followed by a further first time period. The contiguous sequence of first, second and third time periods will occur at least when the envelope signal decays for longer than the period of operation of the hold timer, however.

Embodiments of the invention provide digital audio processing apparatus for applying a time-varying gain to an input digital audio signal in response to the envelope magnitude of the input digital audio signal, in which: the applied gain changes in response to an increasing envelope magnitude at no more than a first maximum rate of change; and the applied gain changes in response to the envelope magnitude being lower than a magnitude corresponding to a current applied gain, at a rate of change varying monotonically from a predetermined initial rate of change (e.g. a substantially zero rate of change) towards a second maximum rate of change.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Digital audio processing apparatus for applying a time-varying gain to an input digital audio signal over adjacent first, second and third time periods, in which:

(i) said applied time varying gain changes at no more than a first maximum rate of change during said first time period;

(ii) said applied time varying gain changes at no more than a second maximum rate of change during the third time period; and (iii) during said second time period the rate of change of said applied time varying gain varies nonlinearly from an initial least rate of change at the start of said second time period to said second maximum rate of change at said third time period in such a manner so as to have a gradual change of said time varying applied gain from said second to third time periods providing a smooth transition from the initial least rate of change to said second maximum rate of change.

2. Apparatus according to claim 1, in which said initial least rate of change is a substantially zero rate of change.

3. Apparatus according to claim 1, in which said applied gain changes in opposite respective directions during said first and third time periods.

4. Apparatus according to claim 3, said apparatus being a compression apparatus in which:

said applied gain decreases during said first time period; and said applied gain increases during said third time period.

5. Digital audio processing apparatus for applying a time-varying gain over adjacent first, second and third time periods to an input digital audio signal in response to the envelope magnitude of said input digital audio signal in response to the envelope magnitude of said input digital audio signal, in which:

(i) said applied time varying gain changes in response to an increasing envelope magnitude at no more than a first maximum rate of change; and (ii) said applied time varying gain when said envelope magnitude is less than a magnitude of a current applied gain, changes at a rate of change varying nonlinearly from a predetermined initial rate of change towards a second maximum rate of change from said second time period to said third time period.

6. Digital audio processing apparatus for applying a time-varying gain to an input digital audio signal over adjacent first, second and third time periods, in which:

(i) said applied time varying gain changes at no more than a first maximum rate of change during said first time period;

(ii) said applied time varying gain changes at no more than a second maximum rate of change during the third time period; and (iii) during said second time period the rate of change of said applied time varying gain varies substantially linearly from an initial least rate of change at the start of said second time period to said second maximum rate of change at said third time period in such a manner so as to have a gradual change of said time varying applied gain from said second to third time periods providing a smooth transition from the initial least rate of change to said second maximum rate of change.

7. Apparatus according to claim 6, in which said initial least rate of change is a substantially zero rate of change.

8. Apparatus according to claim 6, in which said applied gain changes in opposite respective directions during said first and third time periods.

9. Apparatus according to claim 8, said apparatus being a compression apparatus in which:

said applied gain decreases during said first time period; and said applied gain increases during said third time period.

10. Digital audio processing apparatus for applying a time-varying gain over adjacent first, second and third time periods to an input digital audio signal in response to the envelope magnitude of said input digital audio signal in response to the envelope magnitude of said input digital audio signal, in which:

(i) said applied time varying gain changes in response to an increasing envelope magnitude at no more than a first maximum rate of change; and (ii) said applied time varying gain when said envelope magnitude is less than a magnitude of a current applied gain, changes at a rate of change varying substantially linearly from a predetermined initial rate of change towards a second maximum rate of change from said second time period to said third time period.

* * * * *